United States Patent
Tu et al.

(10) Patent No.: US 9,553,143 B2
(45) Date of Patent: Jan. 24, 2017

(54) SEMICONDUCTOR DEVICE AND METHOD FOR FABRICATING THE SAME

(71) Applicant: VANGUARD INTERNATIONAL SEMICONDUCTOR CORPORATION, Hsinchu (TW)

(72) Inventors: Shang-Hui Tu, Jhubei (TW); Yu-Lung Chin, Tainan (TW); Shin-Cheng Lin, Tainan (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 14/620,993

(22) Filed: Feb. 12, 2015

(65) Prior Publication Data

US 2016/0240663 A1    Aug. 18, 2016

(51) Int. Cl.
    *H01L 29/06*     (2006.01)
    *H01L 29/423*    (2006.01)
    *H01L 29/78*     (2006.01)
    *H01L 29/66*     (2006.01)

(52) U.S. Cl.
    CPC ....... *H01L 29/0653* (2013.01); *H01L 29/4236* (2013.01); *H01L 29/66621* (2013.01); *H01L 29/66659* (2013.01); *H01L 29/7835* (2013.01)

(58) Field of Classification Search
    None
    See application file for complete search history.

(56) References Cited

U.S. PATENT DOCUMENTS

| | | | | |
|---|---|---|---|---|
| 2007/0278568 A1* | 12/2007 | Williams | .............. | H01L 21/761 257/335 |
| 2009/0256212 A1* | 10/2009 | Denison | .............. | H01L 29/0653 257/408 |
| 2010/0032755 A1* | 2/2010 | Benaissa | ......... | H01L 21/823814 257/337 |
| 2010/0252882 A1* | 10/2010 | Denison | .............. | H01L 29/0865 257/337 |
| 2014/0021534 A1* | 1/2014 | Verma | ............... | H01L 21/82385 257/330 |
| 2014/0021536 A1* | 1/2014 | Darwish | ............... | H01L 29/408 257/330 |

(Continued)

FOREIGN PATENT DOCUMENTS

TW    200929381 A    7/2009
TW    201027630 A    7/2010

*Primary Examiner* — William Coleman
*Assistant Examiner* — Kien Ly
(74) *Attorney, Agent, or Firm* — Birch, Stewart, Kolasch & Birch, LLP

(57) ABSTRACT

A semiconductor device includes: a semiconductor substrate; a semiconductor layer disposed over the semiconductor layer; a first well region disposed in the semiconductor layer and the semiconductor substrate; a second well region disposed in the semiconductor layer; a first isolation element disposed in the first well region; a second isolation element disposed in the second well region; a gate structure disposed in the semiconductor layer between the first isolation element and the second isolation element; a first doped region disposed in the first well region; and a second doped region disposed in the second well region. The bottom surface of the gate structure is above, below or substantially level with a bottom surface of the first isolation structure.

20 Claims, 8 Drawing Sheets

(56) References Cited

U.S. PATENT DOCUMENTS

| | | | | |
|---|---|---|---|---|
| 2015/0137229 A1* | 5/2015 | Sulistyanto | ......... | H01L 29/7816 257/339 |
| 2015/0243777 A1* | 8/2015 | Fujii | ................... | H01L 29/7816 257/337 |
| 2015/0349050 A1* | 12/2015 | Fang | ................... | H01L 29/7825 257/339 |

* cited by examiner

SEMICONDUCTOR DEVICE AND METHOD FOR FABRICATING THE SAME

BACKGROUND OF THE INVENTION

Field of the Invention

The present invention relates to integrated circuit (IC) devices, and in particular to a semiconductor device and a method for fabricating the same.

Description of the Related Art

Recently, due to the rapid development of communication devices such as mobile communication devices and personal communication devices, wireless communication products such as mobile phones and base stations have been greatly developed. In wireless communication products, high-voltage elements of lateral double diffused metal-oxide-semiconductor (LDMOS) devices are often used as radio frequency (900 MHz-2.4 GHz) related elements therein.

LDMOS devices not only have a higher operation frequency, but also are capable of sustaining a higher breakdown voltage, thereby having a high output power so that they can be used as power amplifiers in wireless communication products. In addition, due to the fact that LDMOS devices can be formed by conventional CMOS fabrication, LDMOS devices can be fabricated from a silicon substrate which is relatively cost-effective and employs mature fabrication techniques.

BRIEF SUMMARY OF THE INVENTION

An exemplary semiconductor device comprises a semiconductor substrate and a semiconductor layer disposed over the semiconductor substrate. The semiconductor device further comprises a first well region disposed in the semiconductor layer and the semiconductor substrate, and a second well region disposed in the semiconductor layer, being adjacent to the semiconductor layer. The semiconductor device further comprises a first isolation element disposed in the first well region and a second isolation element disposed in the second well region. The semiconductor device further comprises a gate structure disposed in the semiconductor layer between the first and second isolation elements. The semiconductor device further comprises a first doped region disposed in the first well region and a second doped region disposed in the second well region, wherein the semiconductor substrate, the semiconductor layer, and the second well region have a first conductivity type, and the first well region, the first doped region, and the second doped region have a conductivity type that is opposite to the first conductivity type. The bottom surface of the gate structure is above, lower than or level with a bottom surface of the first isolating element.

An exemplary method for fabricating a semiconductor device comprises providing a semiconductor substrate; forming a semiconductor layer over the semiconductor substrate and forming a first well region in the semiconductor layer and the semiconductor substrate. The method further comprises forming a second well region in the semiconductor layer, being adjacent to the first well region, and forming a first isolation element in the first well region and a second isolation element in the second well region. The method further comprises forming a gate structure in the semiconductor layer between the first and second isolation elements, and forming a first doped region in the first well region and a second doped region in the second well region, wherein the semiconductor substrate, the semiconductor layer, and the second well region have a first conductivity type, and the first well region, the first doped region, and the second doped region have a conductivity type opposite to the first conductivity type, and a bottom surface of the gate structure is above, lower than or level with a bottom surface of the first isolating element.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
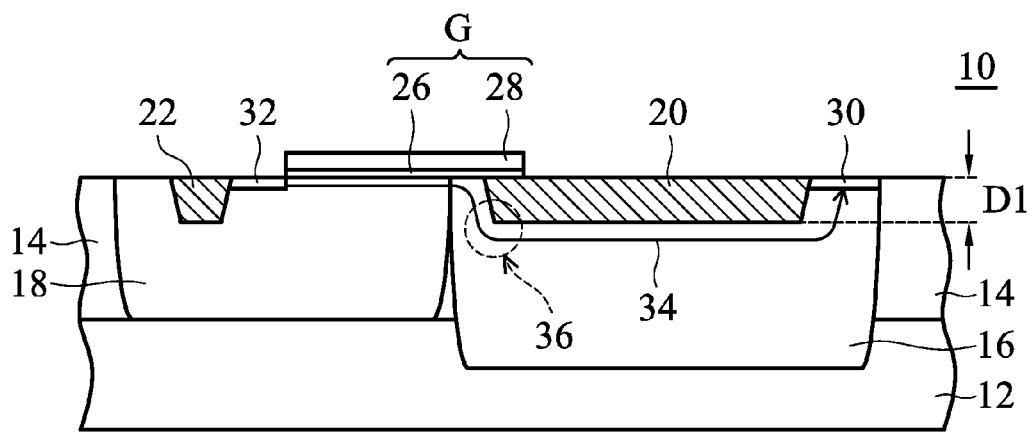
FIG. 1 is schematic cross-section showing a semiconductor device according to an embodiment of the invention.

FIG. 1 is a schematic cross-section showing an exemplary semiconductor device 10. Herein, the semiconductor device 10 is a semiconductor device known by the inventors and is illustrated as a lateral double diffused metal-oxide-semiconductor (LDMOS) device. The semiconductor device 10 is used to describe problems such as current-crowding effects and breakdown-voltage reduction thereof found by the inventors. However, the scope of the exemplary semiconductor devices is not limited by the semiconductor device 10 shown in FIG. 1.

As shown in FIG. 1, the semiconductor device 10 comprises a semiconductor substrate 12 and a semiconductor layer 14 disposed over the semiconductor substrate 12. The semiconductor device 10 further comprises a first well region 16 disposed in the semiconductor layer 14 and the semiconductor substrate 12, and a second well region 18 disposed in the semiconductor layer 14, being adjacent to the first well region 16. The semiconductor device 10 further comprises a first isolation element 20 disposed in the first well region 16, and a second isolation element 22 disposed in the second well region 18. The semiconductor device 10 further comprises a gate structure G disposed over the semiconductor layer 16 between the first isolation element 20 and the second isolation element 22, partially covering the first isolation element 20. The semiconductor device 10 further comprises a first doped region 32 disposed in the first well region 16 and a second doped region 30 disposed in the second well region 18.

As shown in FIG. 1, the semiconductor substrate 12 can be, for example, a silicon substrate, and the semiconductor layer 14 can be an epitaxial semiconductor layer such as an epitaxial silicon layer. The semiconductor substrate 12, the semiconductor layer 14, and the second well region 18 may have a first conductivity type such as n-type or p-type, and the first well region 16, the first doping region 30 and the second doping region 32 may have a second conductivity type opposite to the first conductivity type, such as p-type or n-type. Herein, the gate structure G is illustrated as a planar gate structure, and comprises a gate insulating layer 26 and a conductive layer 28 sequentially disposed over the semiconductor layer 14. The first isolation element 20 and the second isolation element 22 are illustrated as shallow trench isolation (STI) elements, having a distance D1 of about 0.1-2 μm form the bottom surfaces thereof to the top surface of the semiconductor layer 14.

The semiconductor device 10 is capable of a lateral double diffused metal-oxide-semiconductor (LDMOS) device applicable for high-voltage elements. Herein, the first well region 16 may function as a drift region. The second doped region 32 is disposed in the semiconductor layer 14 between the second isolation element 22 and the gate structure G and in a portion of the second well region 18 to function as a source region. The first doped region 30 is disposed in the semiconductor layer 14 and is adjacent to the first isolation element 20 at a side thereof that is not adjacent to the gate structure G, and is disposed in a portion of the first well region 16 to function as a drain region. During operation of the semiconductor device 10, a suitable bias voltage (not shown) is provided between the gate structure G and the first and second doped regions 30 and 32, such that carriers (not shown) such as electrons or electric holes may flow from the second doped region 32 to the first doped region 30 along a path 34. However, the carrier flow (not shown) along the path 34 may cause current-crowding effects at the corner 36 of the first isolation element 20 due to a large-angle turn at the corner 36 of the path 34, thereby affecting the reliability of the semiconductor device 10. In addition, during operation of the semiconductor device 10, it is found that the distribution of lines of electric force may also show field-crowding effects at the corner 36 of the first isolation element 20, thereby reducing the breakdown voltage of the semiconductor device 10.

Accordingly, a semiconductor device and a method for fabricating the same are provided to provide a semiconductor device capable of a lateral double diffused metal-oxide-semiconductor (LDMOS) device applicable for high-voltage elements, having reduced or even eliminated current-crowding effects and breakdown-voltage reduction as described above. Therefore, a semiconductor device with improved reliability and better electrical performances can be provided.

FIGS. 2-5 are schematic cross-sections showing an exemplary method for fabricating a semiconductor device 100.

Figure 2:
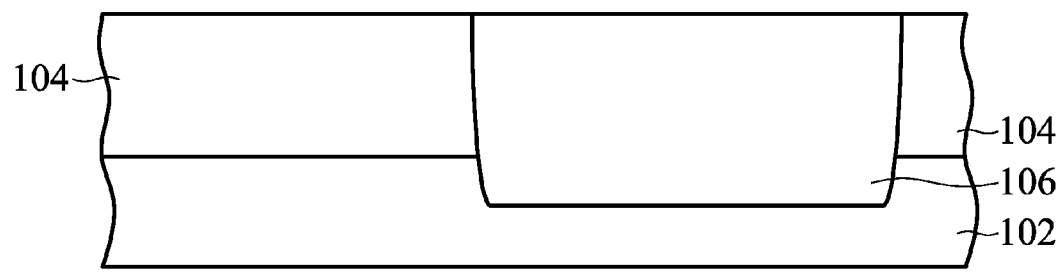
FIGS. 2-5 are schematic cross-sections showing a method for fabricating a semiconductor device according to an embodiment of the invention.

In FIG. 2, a semiconductor substrate 102 such as a silicon substrate is first provided. In one embodiment, the semiconductor substrate 102 may have a first conductivity type, for example p-type, and a resistivity of about 0.001-1000 Ω-cm. Next, a semiconductor layer 104 such as a silicon layer is formed over the semiconductor layer 102 by a method such as an epitaxial growth process. The semiconductor layer 104 can be in-situ doped with dopants of the first conductivity type, for example p-type, and has a resistivity of about 0.001-1000 Ω-cm. In one embodiment, the resistivity of the semiconductor layer 104 is greater than the resistivity of the semiconductor substrate 102. Next, a patterned mask layer is used and an ion implantation process is performed (both not shown) to form a well region 106 in a portion of the semiconductor layer 104 and the semiconductor substrate 102. The well region 106 is doped with dopants of a second conductivity type, for example n-type, opposite to the first conductivity type of the semiconductor layer 104 and the semiconductor substrate 102, having a resistivity of about 0.01-100 Ω-cm.

Figure 3:
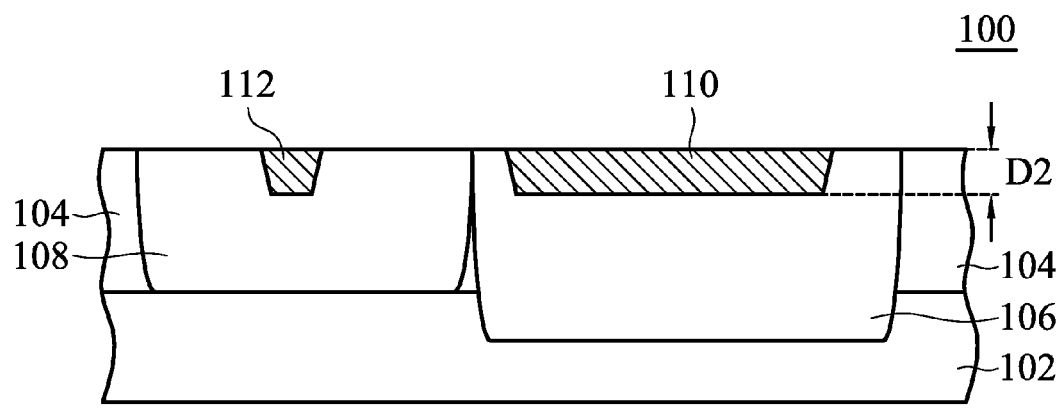

In FIG. 3, after removal of the patterned mask layer used for forming the well region 106, another patterned mask layer is used and another ion implantation process is performed (both not shown) to form a well region 108 in a portion of the semiconductor layer 104 adjacent to the well region 106. The well region 108 is doped with dopants of the first conductivity type, for example p-type, the same as those in the semiconductor layer 104 and the semiconductor substrate 102, having a resistivity of about 0.01-100 Ω-cm. Next, an isolation element 110 is formed in a portion of the well region 106, and an isolation element 112 is formed in a portion of the well region 108. The isolation elements 110 and 112 are illustrated as shallow trench isolation (STI) elements, and can be formed by conventional shallow trench isolation (STI) fabrication processes and may comprise insulating materials such as silicon oxide. The isolation elements 110 and 112 have a distance D1 of about 0.1-2 μm form the bottom surfaces thereof to the top surface of the semiconductor layer 104.

Figure 4:
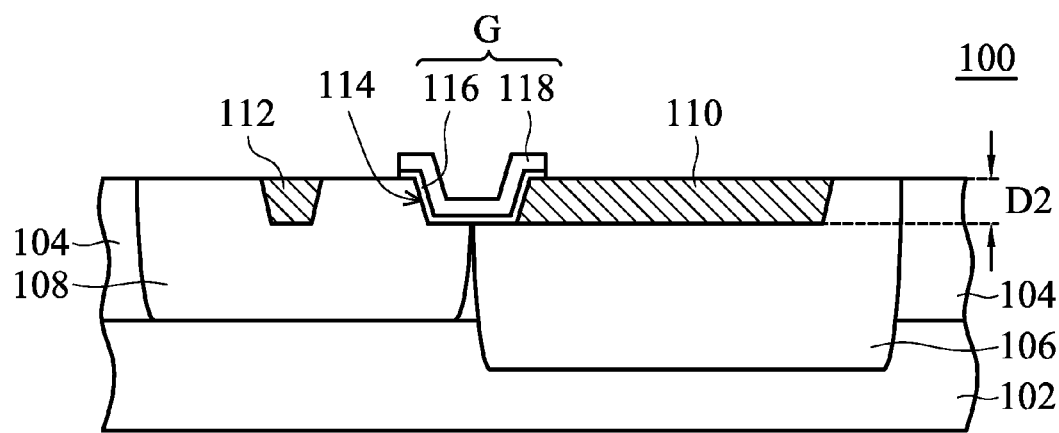

In FIG. 4, after removal of the patterned mask layer used for forming the well region 108, another patterned mask layer is used and an etching process is performed (both not shown) to form a recess 114 in a portion of semiconductor layer 104 of the adjacent well regions 106 and 108. During formation of the recess 114, a portion of the isolation element 110 can be optionally removed, thereby forming a recess of a U-like shape. It should be noted that the bottom surface of the recess 114 is substantially level with the bottom surfaces of the isolation elements 110 and 112, such that there is no depth difference between the bottom surface of the recess 114 and the bottom surfaces of the isolation elements 110 and 112. Next, a patterned gate structure G is formed over surfaces of the semiconductor layer 104 and the isolation element 110 exposed by the recess 114 and surfaces of the semiconductor layer 104 adjacent to the recess 114. Herein, the patterned gate structure G is adjacent to the isolation element 110 and partially covers the top surface of the isolation element 110. The patterned gate structure G may comprise a gate insulating layer 116 and a conductive layer 118 that are sequentially formed. The patterned gate structure G can be formed by conventional gate fabrication processes, and the gate insulating layer 116 and the conductive layer 118 may comprise conventional gate materials, such that materials and fabrication of the patterned gate structure G will not be described here again for the purpose of clarity. Herein, the bottom surface of the portion of the patterned gate structure G in the recess 114 formed in the semiconductor layer 104 is substantially level with the bottom surfaces of the isolation elements 110 and 112, having no depth difference therebetween.

Figure 5:
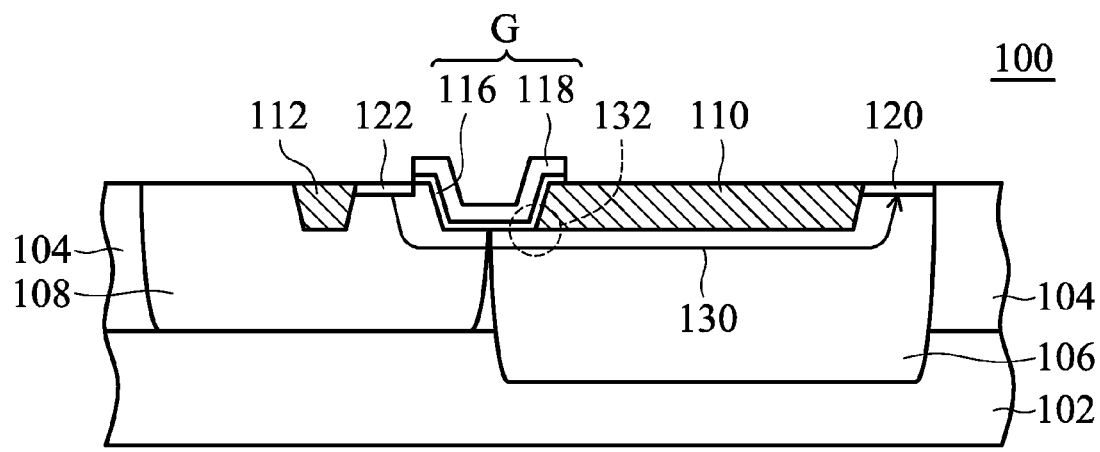

In FIG. 5, after removal of the patterned mask layer used for forming the recess 114, another patterned mask layer is used and another ion implantation process is performed (both not shown) to form a doped region 120 in a portion of the well region 106 adjacent to a side of the isolation element 110 not contacting the gate structure G and a doped region 122 in a portion of the well region 108 between the isolation element 112 and the gate structure G. The doped regions 120 and 122 are doped with dopants of the second conductivity type, for example n-type, opposite to the first conductivity type, having a resistivity of about 0.1-10 Ω-cm.

Therefore, fabrication of the semiconductor device 100 is substantially completed, and the semiconductor device as shown in FIG. 5 is capable of a lateral double diffused metal-oxide-semiconductor (LDMOS) device applicable for high-voltage elements. The well region 106 may function as a drift region, and the doped region 122 may function as a source region, and the doped region 120 may function as a drain region. During operation of the semiconductor device 100, a suitable bias voltage (not shown) is provided between the gate structure G and the doped regions 120 and 122, such that carriers (not shown) such as electrons or electric holes may flow from the doped region 122 to the doped region 120 along a path 130. Herein, since a portion of the gate structure G is disposed in the semiconductor layer 104 and the bottom surface thereof is substantially level with the bottom surface of the adjacent isolation element 110, such that flowing of the carriers (not shown) along the path 130 will not produce current-crowding effect at a corner 132 of the isolation element 130 due to turning of the path 130 when compares to the path 34 of the semiconductor device 100 shown in FIG. 1, thereby ensuring reliability of the semiconductor device 100. In addition, due to formation of FIG. 5, during operation 100 of the semiconductor device 100, it is also found that the distribution of lines of electric force will not produce a field crowding effect at the corner 132 of the isolation element 110, such that reduction of breakdown voltage of the semiconductor device 100 is prevented.

Accordingly, based on the fabrication method shown in FIGS. 2-5, a semiconductor device having reduced or even eliminated undesired current-crowding effects and break-down-voltage reduction as described above can be provided, and the semiconductor device is capable of a lateral double diffused metal-oxide-semiconductor (LDMOS) device applicable for high-voltage elements.

Figure 6:
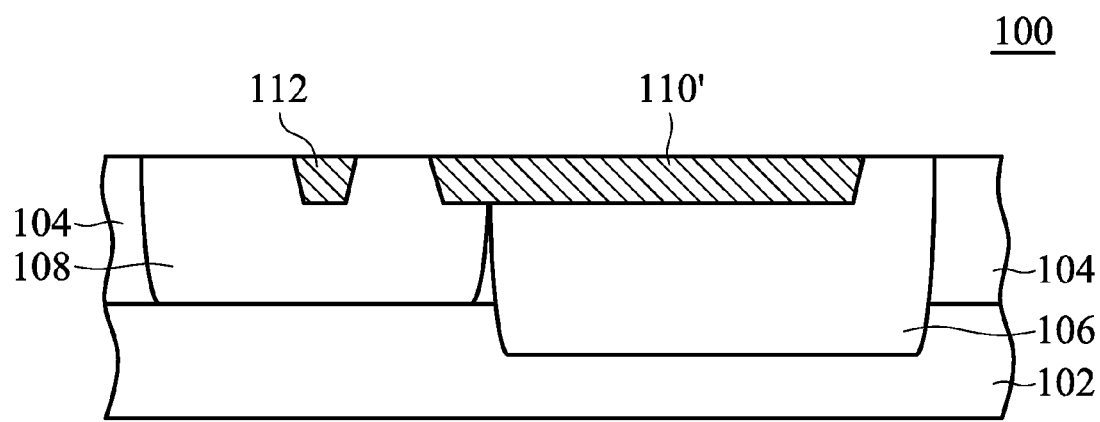
FIGS. 6-8 are schematic cross-sections showing a method for fabricating a semiconductor device according to another embodiment of the invention.
Figure 7:
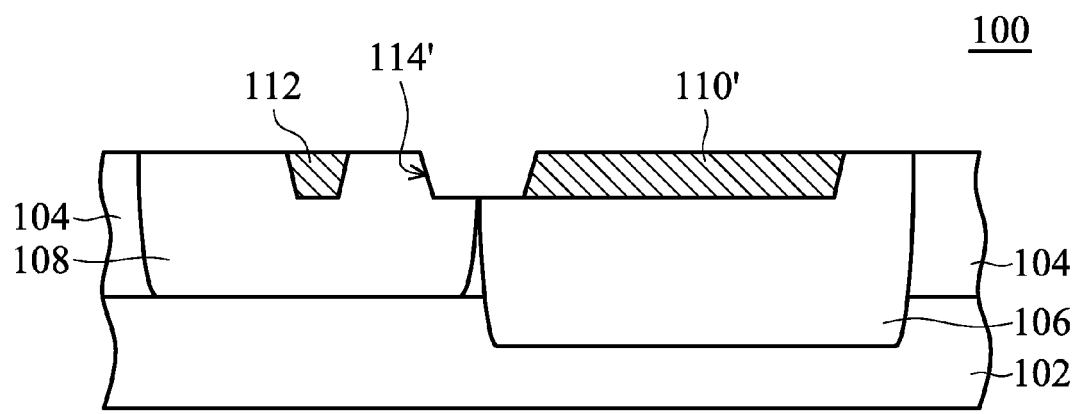
Figure 8:
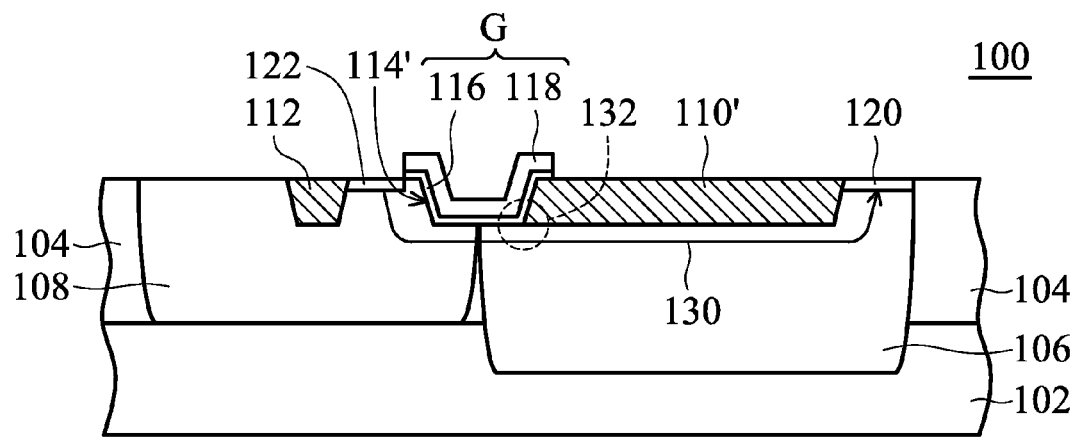

FIGS. 6-8 are schematic cross-sections showing another exemplary method for fabricating a semiconductor device. Herein, the method for fabricating a semiconductor device as shown in FIGS. 6-8 is modified from the method for fabricating the semiconductor device as shown in FIGS. 2-5. Therefore, only differences between the methods for fabricating the semiconductor device as shown in FIGS. 6-8 and 2-5 are described as below, and the same reference numbers represent the same components.

In FIG. 6, a structure similar with that shown in FIG. 3 is provided by performing the fabrication methods shown in FIGS. 2-3. However, the formed isolation 110' not only comprises the portion of the isolation element 110 shown in FIG. 2, but also an additional portion disposed in the well region 108 that extends toward the well region 108.

In FIG. 7, a patterned mask layer is used and an etching process is performed (both not shown) to form a recess 114' in a portion of the semiconductor layer 104 of the adjacent well regions 106 and 108. During formation of the recess 114', a portion of the isolation element 110' can be optionally removed, thereby forming a recess 114' of a U-like shape. It is noted that the bottom surface of the recess 114' is substantially level with the bottom surfaces of the isolation elements 110 and 112, such that there is no depth difference between the bottom surface of the recess 114' and the bottom surfaces of the isolation elements 110 and 112.

In FIG. 8, a patterned gate structure G is next formed over surfaces of the semiconductor layer 104 and the isolation element 110' exposed by the recess 114' and surfaces of the semiconductor layer 104 and the isolation element 110' adjacent to the recess 114'. Herein, the patterned gate structure G is adjacent to the isolation element 110' and partially covers the top surface of the isolation element 110'. The patterned gate structure G may comprise a gate insulating layer 116 and a conductive layer 118 that are sequentially formed. The patterned gate structure G can be formed by conventional gate fabrication processes, and the gate insulating layer 116 and the conductive layer 118 may comprise conventional gate materials, such that materials and fabrication of the patterned gate structure G will not be described here again for the purpose of clarity. Herein, the bottom surface of the portion of the patterned gate structure G formed in the recess 114' in the semiconductor layer 104 is substantially level with the bottom surfaces of the isolation elements 110 and 112, having no depth difference therebetween.

As shown in FIG. 8, fabrication of the semiconductor device 100 is substantially fabricated by performing the processes shown in FIG. 5. The semiconductor device 100 shown in FIG. 8 is the same as the semiconductor device 100 shown in FIG. 5, and the semiconductor device 100 as shown in FIG. 8 is capable of a lateral double diffused metal-oxide-semiconductor (LDMOS) device applicable for high-voltage elements, thereby having advantages such as reduced or even eliminated undesired current-crowding effects and breakdown-voltage reduction as described above.

The exemplary semiconductor devices are not limited by those shown in FIGS. 5 and 8, and may comprise the semiconductor devices shown in FIGS. 9-15. Herein, the semiconductor devices shown in FIGS. 9-15 can be modified by the semiconductor device 100 shown in FIGS. 5 and 8. Therefore, only differences between the methods for fabricating the semiconductor device as shown in FIGS. 9-15 and FIGS. 5 and 8 are described as below, and the same reference numbers represent the same components.

Figure 9:
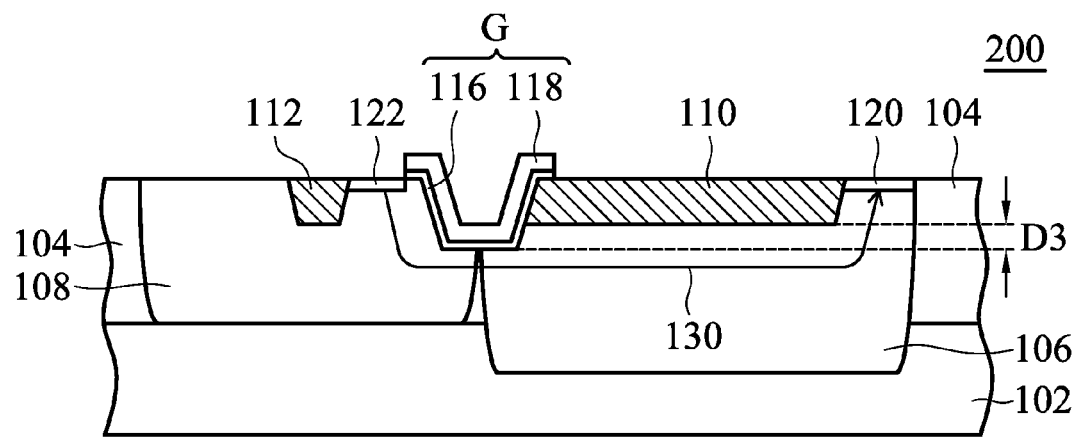
FIG. 9 is schematic cross-section showing a semiconductor device according to another embodiment of the invention.

In FIG. 9, a schematic cross-section showing another exemplary semiconductor device 200 is illustrated. Herein, unlike the semiconductor device 100 shown in FIGS. 5 and 8, the bottom surface of the portion of the gate structure G disposed in the semiconductor layer 104 in the semiconductor device 200 shown in FIG. 9 is lower than the bottom surface of the isolation elements 110 and 112, having a depth difference D3 less than 0.1 μm between the bottom surface of the portion of the gate structure G in the semiconductor layer 104 and the isolation elements 110 and 112. In one embodiment, the depth difference D3 is preferably less than 0.05 μm. Therefore, the semiconductor device 200 may have advantages such as reduced or even eliminated undesired current-crowding effects and breakdown-voltage reduction as described.

Figure 10:
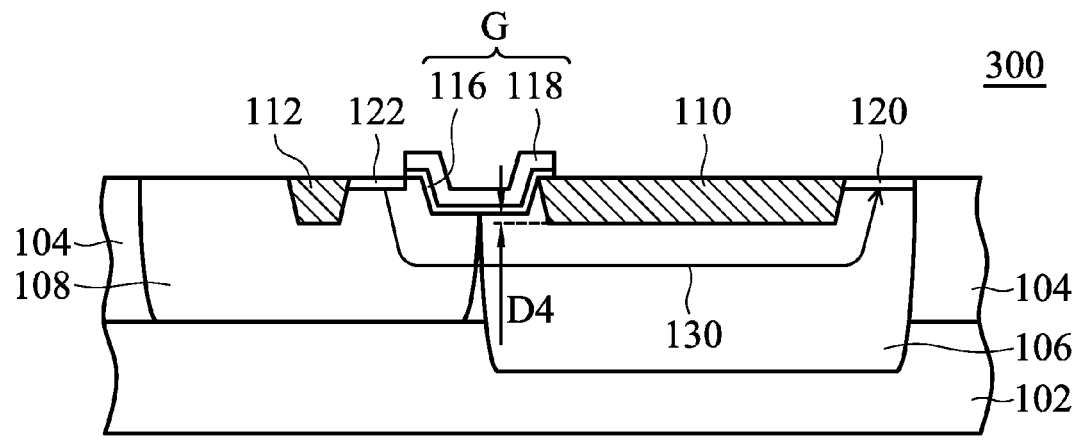
FIG. 10 is schematic cross-section showing a semiconductor device according to yet another embodiment of the invention.

In FIG. 10, a schematic cross-section showing yet another exemplary semiconductor device 300 is illustrated. Herein, unlike the semiconductor device 100 shown in FIGS. 5 and 8, the bottom surface of the portion of the gate structure G disposed in the semiconductor layer 104 in the semiconductor device 300 shown in FIG. 10 is above the bottom surface of the isolation elements 110 and 112, having a depth difference D4 less than 0.1 μm between the bottom surface of the portion of the gate structure G in the semiconductor layer 104 and the isolation elements 110 and 112. In one embodiment, the depth difference D4 is preferably less than 0.05 μm. Therefore, the semiconductor device 300 may have advantages such as reduced or even eliminated undesired current-crowding effects and breakdown-voltage reduction as described above.

Figure 11:
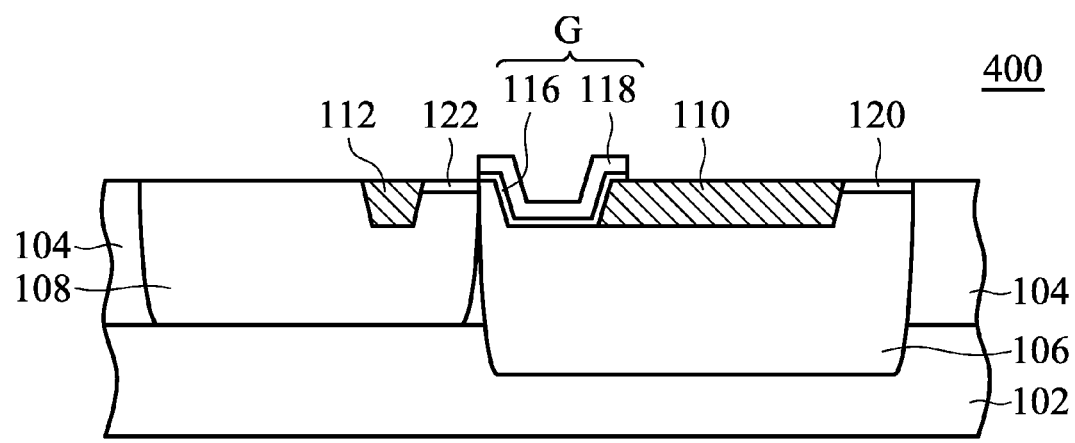
FIG. 11 is schematic cross-section showing a semiconductor device according to another embodiment of the invention.

In FIG. 11, a schematic cross-section showing another exemplary semiconductor device 400 is illustrated. Herein, unlike the semiconductor device 100 shown in FIGS. 5 and 8, the gate structure G in the semiconductor device 400 shown in FIG. 11 is only disposed in the semiconductor layer 104 of the well region 106 and covers portions of the top surface of the adjacent isolation element 100, and the doped region 122 is disposed in a portion of the semiconductor layer 104 of the well region 108 adjacent to the well region 106.

Figure 12:
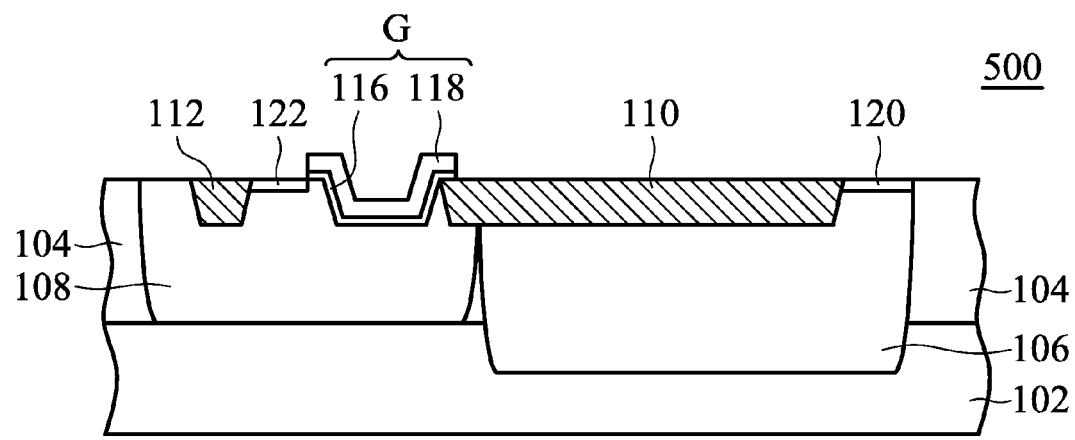
FIG. 12 is schematic cross-section showing a semiconductor device according to yet another embodiment of the invention.

In FIG. 12, a schematic cross-section showing yet another exemplary semiconductor device 500 is illustrated. Herein, unlike the semiconductor device 100 shown in FIGS. 5 and 8, in the semiconductor device 500 shown in FIG. 12, the isolation element 110 extends into a portion of the well region 108, and the gate structure G is only disposed in the semiconductor layer 104 in the well region 108 and covers portions of the top surface of the adjacent isolation element 110.

Figure 13:
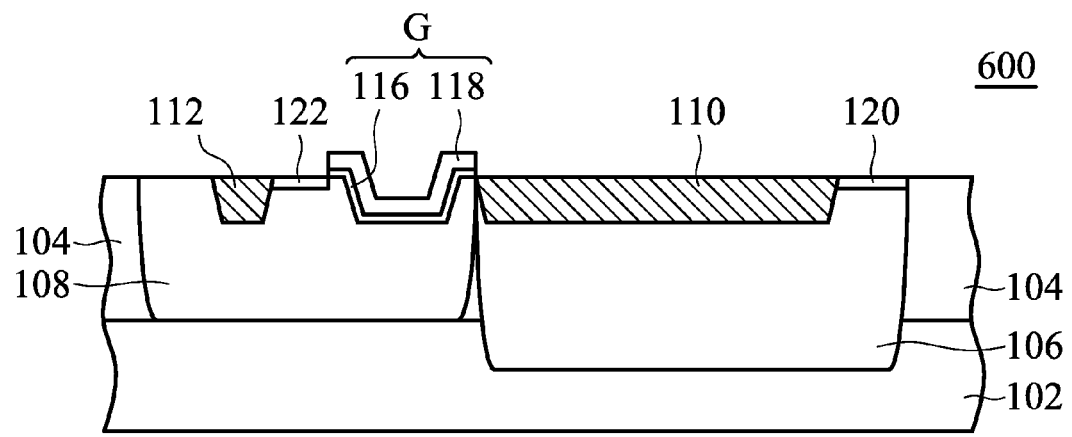
FIG. 13 is schematic cross-section showing a semiconductor device according to another embodiment of the invention.

In FIG. 13, a schematic cross-section showing another exemplary semiconductor device 600 is illustrated. Herein, unlike the semiconductor device 100 shown in FIGS. 5 and 8, the isolation element 110 in the semiconductor device 600 shown in FIG. 13 is extended and formed in a portion of the well region 108 adjacent to the well region 106, and the gate structure G is only disposed in the semiconductor layer 104 of the well region 108 but does not cover the top surface of the adjacent isolation element 110.

Figure 14:
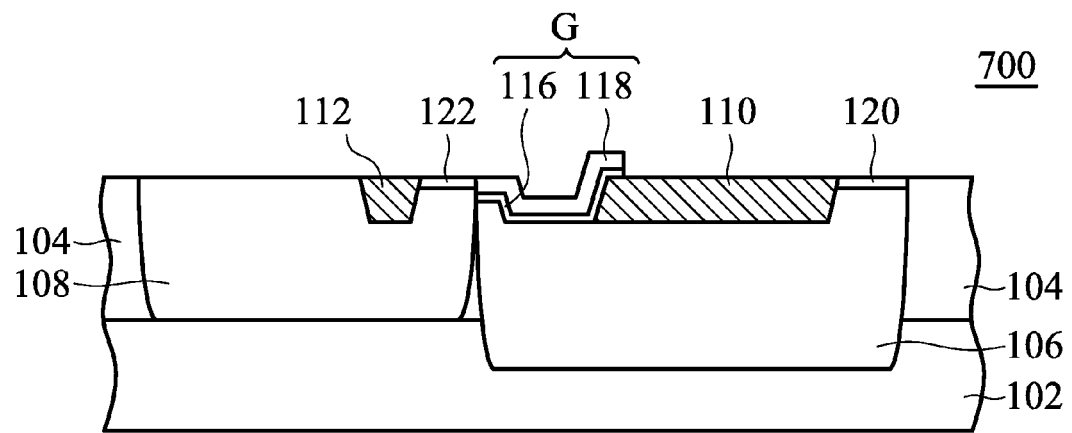
FIG. 14 is schematic cross-section showing a semiconductor device according to yet another embodiment of the invention.

In FIG. 14, a schematic cross-section showing yet another exemplary semiconductor device 700 is illustrated. Herein, unlike the semiconductor device 100 shown in FIGS. 5 and 8, the gate structure G in the semiconductor device 700 shown in FIG. 14 is only disposed in the semiconductor layer 104 of the well region 106 and covers the top surface of the adjacent isolation element 110, and the doped region 122 is disposed in a portion of the well region 108 adjacent to the well region 106. Herein, the gate structure G is formed with a zig-zag-like shape, which is different from the U-like shape shown in FIGS. 5 and 8.

Figure 15:
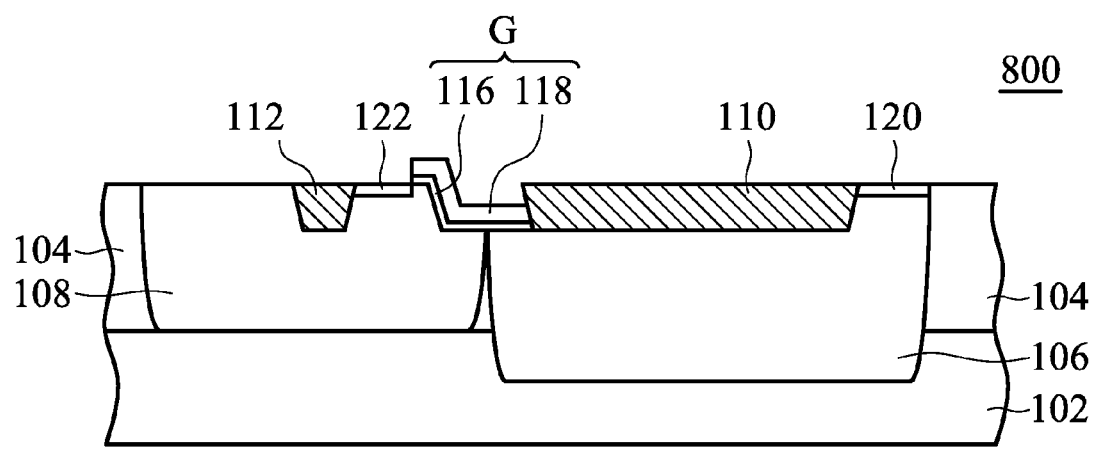
FIG. 15 is schematic cross-section showing a semiconductor device according to another embodiment of the invention.

In FIG. 15, a schematic cross-section showing another exemplary semiconductor device 800 is illustrated. Herein, unlike the semiconductor device 100 shown in FIGS. 5 and 8, the gate structure G in the semiconductor device 800 shown in FIG. 15 is formed with a zig-zag-like shape and only covers the top surface of the semiconductor layer 104 of the well region 106 but not covers the top surface of the adjacent isolation element 110, and the doped region 122 is disposed in a portion of the well region 108 adjacent to the well region 106.

The semiconductor devices shown in FIGS. 9-15 can be formed by the fabrication methods shown in FIGS. 2-5 and 6-8 by only modifying the locations of the predetermined components and the pattern of the patterned mask layer for forming the same, such that fabrications thereof are not described here for clarity. In addition, although the bottom surface of the gate structure G in the semiconductor devices 400, 500, 600, 700, and 800 shown in FIG. 11-15 are illustrates as being level with the bottom surface of the bottom surface of the isolation elements 110 and 112. However, in other embodiments, the bottom surface of the gate structure G in the semiconductor devices 400, 500, 600, 700, and 800 shown in FIG. 11-15 can be adjusted to be above or lower than the bottom surface of the isolation elements 110 and 112, as shown in FIGS. 9-10, thereby having a depth difference less than 0.1 μm. In one embodiment, the depth difference is preferably less than 0.05 μm. Accordingly, the semiconductor devices 400, 500, 600, 700 and 800 may have advantages such as reduced or even eliminated undesired current-crowding effects and breakdown-voltage reduction as described above.

Similar with the semiconductor device 100 shown in FIGS. 5 and 8, the semiconductor devices 400, 500, 600, 700 and 800 shown in FIGS. 9-15 are capable of a lateral double diffused metal-oxide-semiconductor (LDMOS) device applicable for high-voltage elements, and may have advantages such as reduced or even eliminated undesired current-crowding effects and breakdown-voltage reduction as described above.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
a semiconductor substrate;
a semiconductor layer disposed over the semiconductor substrate;
a first well region disposed in the semiconductor layer and the semiconductor substrate;
a second well region disposed in the semiconductor layer, being adjacent to the first well region;
a first isolation element disposed in the first well region;
a second isolation element disposed in the second well region;
a gate structure disposed in the first and second well regions, between the first and second isolation elements, and having a zig-zag like shape or a U-like shape, wherein the gate structure comprises a gate insulating layer and a conductive layer overlaying the gate insulating layer, a bottom surface of the conductive layer is above a bottom surface of the first well region and a bottom surface of the second well region, and the bottom surface of the conductive layer is below a top surface of the first well region and a top surface of the second well region;
a first doped region disposed in the first well region; and
a second doped region disposed in the second well region, wherein the semiconductor substrate, the semiconductor layer, and the second well region have a first conductivity type, and the first well region, the first doped region, and the second doped region have a conductivity type that is opposite to the first conductivity type, and a bottom surface of the gate structure is above, lower than or level with a bottom surface of the first isolating element.

2. The semiconductor device as claimed in claim 1, wherein the first conductivity type is p-type, and the second conductivity type is n-type.

3. The semiconductor device as claimed in claim 1, wherein the first conductivity type is n-type, and the second conductivity type is p-type.

4. The semiconductor device as claimed in claim 1, wherein the bottom surface of the gate structure is above or lower than the bottom surface of the first isolation element, having a depth difference less than 0.1 µm therebetween.

5. The semiconductor device as claimed in claim 1, wherein the bottom surface of the gate structure is level with the bottom surface of the first isolation element, having no depth difference therebetween.

6. The semiconductor device as claimed in claim 1, wherein the first and second isolation elements are shallow trench isolation elements.

7. A method for fabricating a semiconductor device, comprising:
    providing a semiconductor substrate;
    forming a semiconductor layer over the semiconductor substrate;
    forming a first well region in the semiconductor layer and the semiconductor substrate;
    forming a second well region in the semiconductor layer, being adjacent to the first well region;
    forming a first isolation element in the first well region and a second isolation element in the second well region;
    forming a gate structure in the first and second well regions, between the first and second isolation elements, and having a zig-zag like shape or a U-like shape, wherein the gate structure comprises a gate insulating layer and a conductive layer overlaying the gate insulating layer, a bottom surface of the conductive layer is above a bottom surface of the first well region and a bottom surface of the second well region, and the bottom surface of the conductive layer is below a top surface of the first well region and a top surface of the second well region; and
    forming a first doped region in the first well region and a second doped region in the second well region, wherein the semiconductor substrate, the semiconductor layer, and the second well region have a first conductivity type, and the first well region, the first doped region, and the second doped region have a conductivity type that is opposite to the first conductivity type, and a bottom surface of the gate structure is above, lower than or level with a bottom surface of the first isolating element.

8. The method as claimed in claim 7, wherein the first conductivity type is p-type, and the second conductivity type is n-type.

9. The method as claimed in claim 7, wherein the first conductivity type is p-type, and the second conductivity type is n-type.

10. The method as claimed in claim 7, wherein the bottom surface of the gate structure is above or lower than the bottom surface of the first isolation element, having a depth difference less than 0.1 µm therebetween.

11. The method as claimed in claim 7, wherein the bottom surface of the gate structure is level with the bottom surface of the first isolation element, having no depth difference therebetween.

12. The method as claimed in claim 7, wherein the first and second isolation elements are shallow trench isolation elements.

13. The method as claimed in claim 7, wherein forming the gate structure in the first and second well regions, and between the first and second isolation elements comprises:
    forming a recess in a portion of the semiconductor layer between the adjacent first and second well regions, wherein the recess is adjacent to the first isolation element and has a U-like shape; and
    forming the gate structure over the semiconductor layer between the first and second isolation elements and over the recess.

14. The method as claimed in claim 7, wherein the first isolation element is further formed in a portion of the second well region, and forming the gate structure in the first and second well regions, and between the first and second isolation elements comprises:
    forming a recess in a portion of the semiconductor layer between the adjacent first and second well regions, wherein the recess is adjacent to the first isolation element and has a U-like shape, and the portion of the first isolation element in the second well region and a portion of the first isolation element in the first well region are removed during formation of the recess; and
    forming the gate structure over the semiconductor layer between the first and second isolation elements and over the recess.

15. A semiconductor device, comprising:
    a semiconductor substrate;
    a semiconductor layer disposed over the semiconductor substrate;
    a first well region disposed in the semiconductor layer and the semiconductor substrate;
    a second well region disposed in the semiconductor layer, being adjacent to the first well region;
    a first isolation element disposed in the first well region;
    a second isolation element disposed in the second well region;
    a gate structure disposed in the first well region, between the first and second isolation elements, and having a zig-zag like shape or a U-like shape, wherein the gate structure comprises a gate insulating layer and a conductive layer overlaying the gate insulating layer, a bottom surface of the conductive layer is above a bottom surface of the first well region and a bottom surface of the second well region, and the bottom surface of the conductive layer is below a top surface of the first well region and a top surface of the second well region;
    a first doped region disposed in the first well region; and
    a second doped region disposed in the second well region, wherein the semiconductor substrate, the semiconductor layer, and the second well region have a first conductivity type, and the first well region, the first doped region, and the second doped region have a conductivity type that is opposite to the first conductivity type, and a bottom surface of the gate structure is above, lower than or level with a bottom surface of the first isolating element.

16. A semiconductor device, comprising:
    a semiconductor substrate;
    a semiconductor layer disposed over the semiconductor substrate;
    a first well region disposed in the semiconductor layer and the semiconductor substrate;
    a second well region disposed in the semiconductor layer, being adjacent to the first well region;
    a first isolation element disposed in the first well region;

a second isolation element disposed in the second well region;

a gate structure disposed in the second well region, between the first and second isolation elements, and having a zig-zag like shape or a U-like shape, wherein the gate structure comprises a gate insulating layer and a conductive layer overlaying the gate insulating layer, a bottom surface of the conductive layer is above a bottom surface of the first well region and a bottom surface of the second well region, and the bottom surface of the conductive layer is below a top surface of the first well region and a top surface of the second well region;

a first doped region disposed in the first well region; and a second doped region disposed in the second well region, wherein the semiconductor substrate, the semiconductor layer, and the second well region have a first conductivity type, and the first well region, the first doped region, and the second doped region have a conductivity type that is opposite to the first conductivity type, and a bottom surface of the gate structure is above, lower than or level with a bottom surface of the first isolating element.

17. The semiconductor device as claimed in claim 16, wherein the first isolation element is further disposed in the second well region.

18. A method for fabricating a semiconductor device, comprising:

providing a semiconductor substrate;

forming a semiconductor layer over the semiconductor substrate;

forming a first well region in the semiconductor layer and the semiconductor substrate;

forming a second well region in the semiconductor layer, being adjacent to the first well region;

forming a first isolation element in the first well region and a second isolation element in the second well region;

forming a gate structure in the first well region, between the first and second isolation elements, and having a zig-zag like shape or a U-like shape, wherein the gate structure comprises a gate insulating layer and a conductive layer overlaying the gate insulating layer, a bottom surface of the conductive layer is above a bottom surface of the first well region and a bottom surface of the second well region, and the bottom surface of the conductive layer is below a top surface of the first well region and a top surface of the second well region; and forming a first doped region in the first well region and a second doped region in the second well region, wherein the semiconductor substrate, the semiconductor layer, and the second well region have a first conductivity type, and the first well region, the first doped region, and the second doped region have a conductivity type that is opposite to the first conductivity type, and a bottom surface of the gate structure is above, lower than or level with a bottom surface of the first isolating element.

19. A method for fabricating a semiconductor device, comprising:

providing a semiconductor substrate;

forming a semiconductor layer over the semiconductor substrate;

forming a first well region in the semiconductor layer and the semiconductor substrate;

forming a second well region in the semiconductor layer, being adjacent to the first well region;

forming a first isolation element in the first well region and a second isolation element in the second well region;

forming a gate structure in the second well region, between the first and second isolation elements, and having a zig-zag like shape or a U-like shape, wherein the gate structure comprises a gate insulating layer and a conductive layer overlaying the gate insulating layer, a bottom surface of the conductive layer is above a bottom surface of the first well region and a bottom surface of the second well region, and the bottom surface of the conductive layer is below a top surface of the first well region and a top surface of the second well region; and forming a first doped region in the first well region and a second doped region in the second well region, wherein the semiconductor substrate, the semiconductor layer, and the second well region have a first conductivity type, and the first well region, the first doped region, and the second doped region have a conductivity type that is opposite to the first conductivity type, and a bottom surface of the gate structure is above, lower than or level with a bottom surface of the first isolating element.

20. The method as claimed in claim 19, wherein the first isolation element is further formed in the second well region.

* * * * *